US007915719B2

(12) United States Patent
Misumi et al.

(10) Patent No.: US 7,915,719 B2
(45) Date of Patent: Mar. 29, 2011

(54) SEMICONDUCTOR DEVICE

(75) Inventors: Kazuyuki Misumi, Tokyo (JP); Kazushi Hatauchi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 362 days.

(21) Appl. No.: 12/210,492

(22) Filed: Sep. 15, 2008

(65) Prior Publication Data
US 2009/0085179 A1    Apr. 2, 2009

(30) Foreign Application Priority Data

Sep. 28, 2007  (JP) ................................. 2007-253405
Jul. 30, 2008   (JP) ................................. 2008-196751

(51) Int. Cl.
  *H01L 23/495*    (2006.01)
  *H01L 21/50*     (2006.01)
(52) U.S. Cl. ....................................... 257/670; 438/123
(58) Field of Classification Search .................. 257/670, 257/686, 777–778, E23.031–E23.059; 438/108, 438/123
See application file for complete search history.

(56) References Cited

U.S. PATENT DOCUMENTS

| 6,507,098 B1 * | 1/2003 | Lo et al. ........................ 257/686 |
| 6,841,870 B2 * | 1/2005 | Misumi ......................... 257/723 |
| 6,867,507 B2   | 3/2005 | Uebayashi et al. |

FOREIGN PATENT DOCUMENTS

| JP | 2003-110082 | 4/2003 |
| JP | 2007-035853 | 2/2007 |

* cited by examiner

*Primary Examiner* — Calvin Lee
(74) *Attorney, Agent, or Firm* — McDermott Will & Emery LLP

(57) ABSTRACT

A semiconductor device comprises: a first and second die pads arranged side by side; a plurality of inner leads arranged around the first and second die pads; first and second chips mounted on the first and second die pads; a bar provided between the first and second chips and the plurality of inner leads, extending in an array direction of the first chip and the second chip; a plurality of wires that connect the first and second chips and the plurality of inner leads and connect the first chip and the second chip; and resin that seals the first and second die pads, the plurality of inner leads, the first and second chips, the plurality of wires and the bar, wherein the bar comprises a mark provided at a position corresponding to an area between the first chip and the second chip in an array direction of the first chip and the second chip.

16 Claims, 10 Drawing Sheets

PRIOR ART

SEMICONDUCTOR DEVICE

BACKGROUND OF THE INVENTION

1. Field of the Invention

The present invention relates to a so-called SIP (System In Package) type semiconductor device in which two chips are mounted side by side on a die pad and sealed with resin.

2. Background Art

FIG. 9 is a plan view showing a conventional semiconductor device in which two chips are mounted side by side on a large die pad. Two chips 16 and 17 are mounted on a die pad 31. Here, the die pad 31 is larger than the chips 16 and 17. The chips 16 and 17 and a plurality of inner leads 15 are connected using a plurality of wires 20 and the chips 16 and 17 are interconnected. Slits 32 are formed in the die pad 31 between the chips 16 and 17. In the manufacturing process of this semiconductor device, when mounting the chips 16 and 17 on the die pad 31, the chips are aligned using the edge of the die pad 31 and the slits 32 as marks. Japanese Patent Laid-Open No. 2007-35853 describes a semiconductor device in which one chip is mounted on a die pad with marks placed thereon.

In recent years, there is proposed a semiconductor device whose die pad is made smaller than a chip to improve a temperature cycle characteristic. This is also being applied to an SIP type semiconductor device with two semiconductor chips mounted side by side on a die pad (e.g., see Japanese Patent Laid-Open No. 2003-110082).

SUMMARY OF THE INVENTION

Since the degree of adhesion between mold resin with which a semiconductor chip is sealed and a metallic die pad is generally not high, peeling is liable to occur between the mold resin and the back of the chip mounting surface of the die pad. Peeling is actually observed in a temperature cycle test. For this reason, downsizing of a die pad is underway also for semiconductor devices with a plurality of chips mounted side by side on the die pad. The present inventor has pointed out the following as points to be considered in downsizing a die pad.

(1) Chips mounted side by side are directly joined together using a wire for an electrical connection. When resin sealing is applied, since this wire prevents a resin flow, it is difficult for resin to be injected between the wire and die pad. However, in the case of the semiconductor device in FIG. 9, resin is injected through the slits 32 used for alignment during chip mounting. When downsizing the die pad, it is also necessary to consider a structure that makes it easier to inject resin below the wire for connecting the chips.

(2) In a case where it is not possible to provide the longitudinal slits 32 shown in FIG. 9 that extend in a direction perpendicular to the direction in which the chips are arranged, it is necessary to consider how to configure marks used for alignment of the two chips when the chips are mounted on the die pad.

The present invention has been implemented to solve the above described problems and it is an object of the present invention to provide a semiconductor device in which two chips are mounted side by side and the two chips are directly interconnected using a wire, capable of preventing resin sealing leakage.

It is another object of the present invention to provide a semiconductor device that makes it easier, when two chips are mounted side by side on a die pad, to align the chips.

According to one aspect of the present invention, a semiconductor device comprises: a first and second die pads arranged side by side; a plurality of inner leads arranged around the first and second die pads; first and second chips mounted on the first and second die pads; a bar provided between the first and second chips and the plurality of inner leads, extending in an array direction of the first chip and the second chip; a plurality of wires that connect the first and second chips and the plurality of inner leads and connect the first chip and the second chip; and resin that seals the first and second die pads, the plurality of inner leads, the first and second chips, the plurality of wires and the bar, wherein the bar comprises a mark provided at a position corresponding to an area between the first chip and the second chip in an array direction of the first chip and the second chip.

The semiconductor device according to this embodiment provides the mark in the bar provided between the first and second chips, and the plurality of inner leads, and thereby makes it easier to align the chips when mounting the two chips side by side on the die pad.

Furthermore, in the semiconductor device according to the other embodiment, since the width of the coupling part (third part) that couples the mounting parts (first and second parts) of the mounting member for mounting the two chips arranged apart from each other is made smaller than the widths of the mounting parts, it is easier to inject resin below the wire that connects the chips.

Other and further objects, features and advantages of the invention will appear more fully from the following description.

DETAILED DESCRIPTION OF THE PREFERRED EMBODIMENTS

First Embodiment

Figure 1:
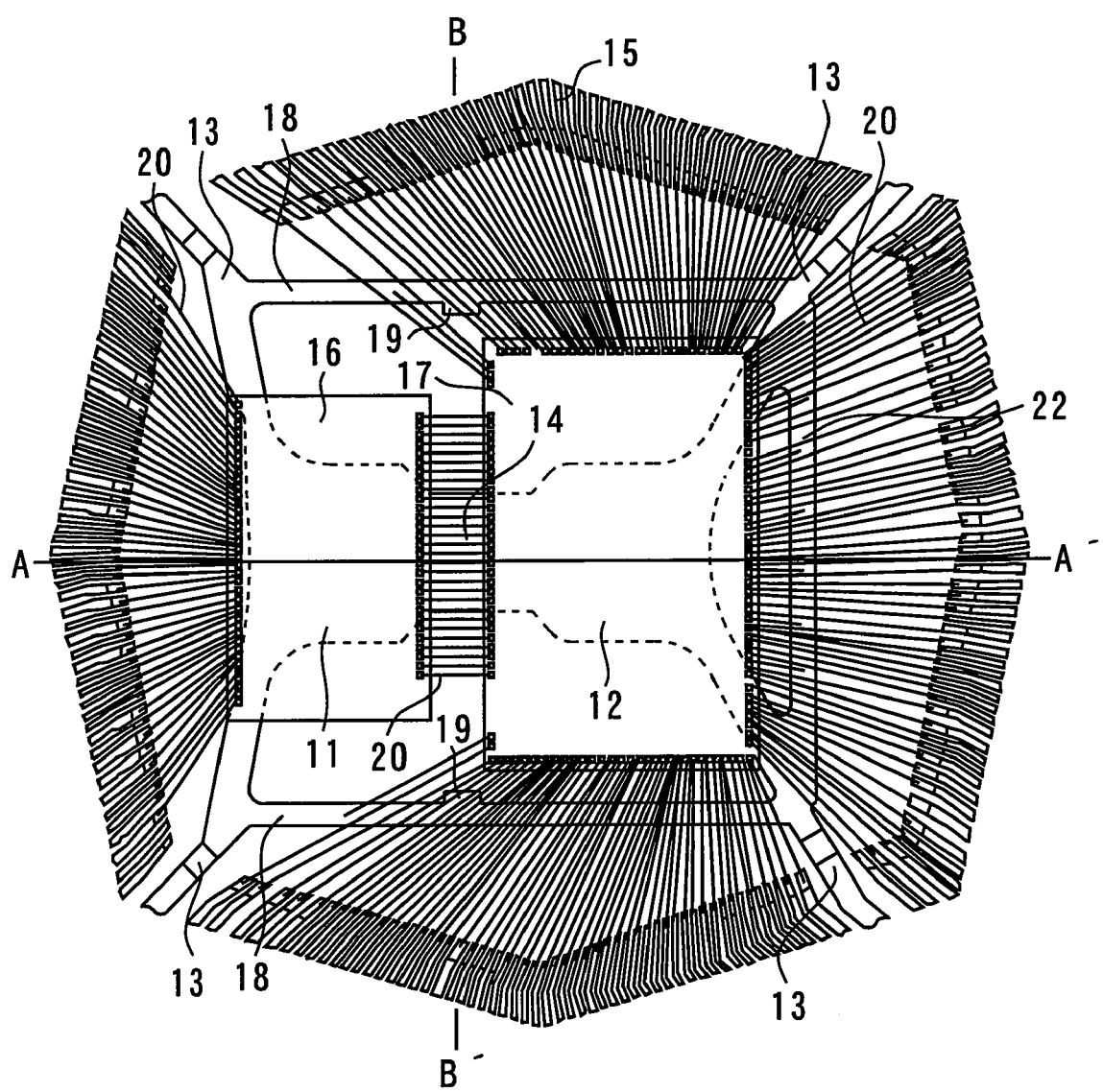
FIG. 1 is a plan view showing the interior of a semiconductor device according to a first embodiment of the present invention.
Figure 2:
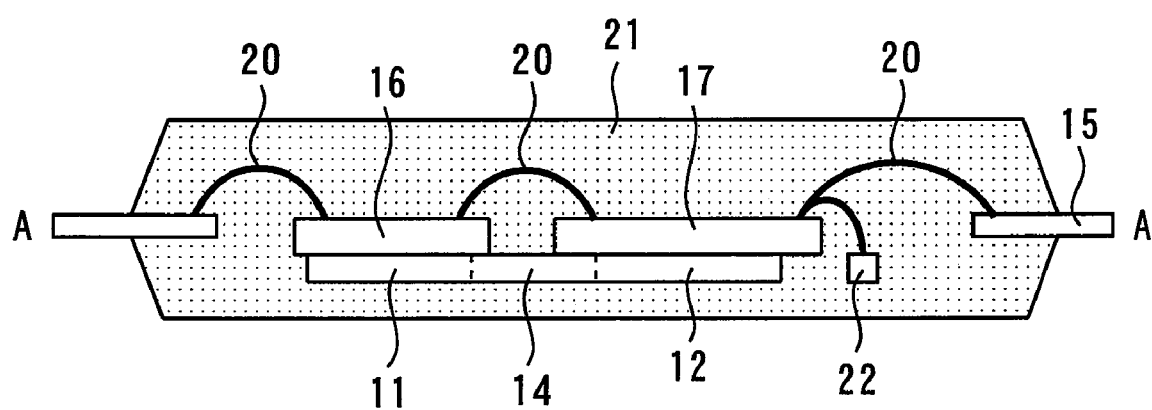
FIG. 2 is a cross-sectional view along A-A' of FIG. 1.
Figure 10:
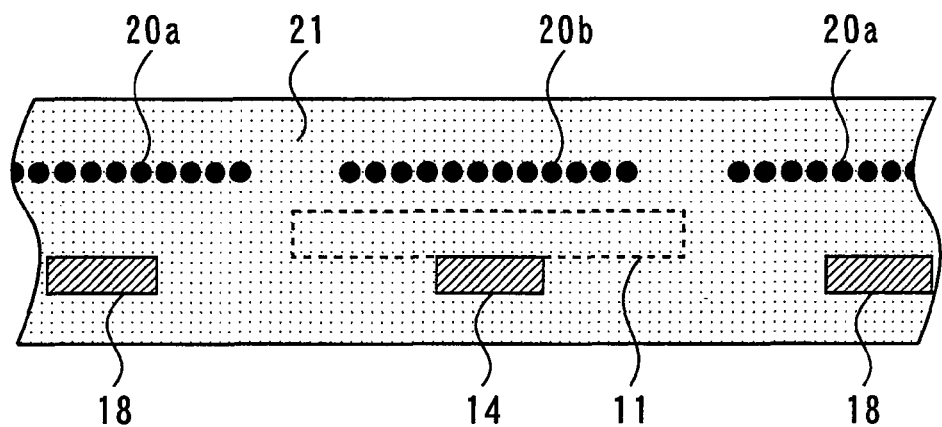
FIG. 10 is a cross-sectional view along B-B' of FIG. 1.

FIG. 1 is a plan view showing the interior of a semiconductor device according to an embodiment of the present invention, FIG. 2 is a cross-sectional view along A-A' of FIG. 1. FIG. 10 is a cross-sectional view along B-B' of FIG. 1. A first die pad 11 (first part) and a second die pad 12 (second part) are arranged side by side. The first and second die pads 11 and 12 are supported by hanger leads 13 and both pads are interconnected by a connection lead 14. The first and second die pads 11 and 12, connection lead 14 and hanger leads 13 constitute a metallic mounting member in which metal members are integrally molded. A plurality of inner leads 15 are arranged around the first and second die pads 11 and 12.

A first chip 16 is mounted with its principal plane superimposed on the first die pad 11 on the principal plane of the first die pad 11 by means of a paste (not shown). Furthermore, a second chip 17 is mounted with its principal plane superimposed on the principal plane of the second die pad 12 by means of a paste (not shown) so as to be aligned with the first chip 16 in a first direction away from each other on the second die pad 12. Here, the first and second die pads 11 and 12 are smaller than the first and second chips 16 and 17 respectively. Furthermore, one side of the second chip 17 is disposed opposed to and at a distance from one side of the first chip 16 in the first direction.

Two bars 18 supported each by a set of two different hanger leads 13 are provided so as to be located between the first and second chips 16 and 17, and some of the plurality of inner leads 15 (a group of leads arrayed between the two hanger leads that support the respective bars 18) viewed from a direction perpendicular to the chip mounting surface of the mounting member and extend along the array direction (first direction) of the first chip 16 and the second chip 17. That is, the two bars 18 are provided so as to face each other across the first and second chips 16 and 17. Furthermore, another bar 22 supported by the two hanger leads 13 is provided between the second chip 17 and some other leads of the plurality of inner leads 15 (a group of leads arrayed between the two hanger leads that support the bar 22) and extends in a direction orthogonal to the extending direction of the bars 18. In this embodiment, the bars 18 and 22 are also integrally molded with the mounting member. Since this mounting member is electrically grounded, the bars 18 and 22 are also electrically grounded.

Furthermore, the two bars 18 are provided with projections 19 respectively as marks at positions facing an area of separation between the first chip 16 and the second chip 17 on the sides facing the first and second chips 16 and 17. That is, the two bars 18 are provided with the projections 19 respectively as marks at positions corresponding to the area between the first chip 16 and the second chip 17 in the array direction of the first chip 16 and the second chip 17. The projections 19 protrude from the sides of the bars 18 in the direction in which the first and second die pads 11 and 12 are arranged and have a predetermined width of an identifiable degree in the extending direction (first direction) of the bars 18.

Via a plurality of wires 20, the first and second chips 16 and 17 and the plurality of inner lead 15 or bars 18 are connected and the first chip 16 and the second chip 17 are connected. Here, as shown in FIG. 10, suppose the wire 20 that connects the first and second chips 16 and 17, and the inner leads 15 is a first wire 20a and the wire 20 that connects the first chip 16 and the second chip 17 is a second wire 20b. The first and second die pads 11 and 12, the plurality of inner leads 15, the first and second chips 16 and 17 and the plurality of wires 20 and the bars 18 are sealed with resin 21.

Figure 3:
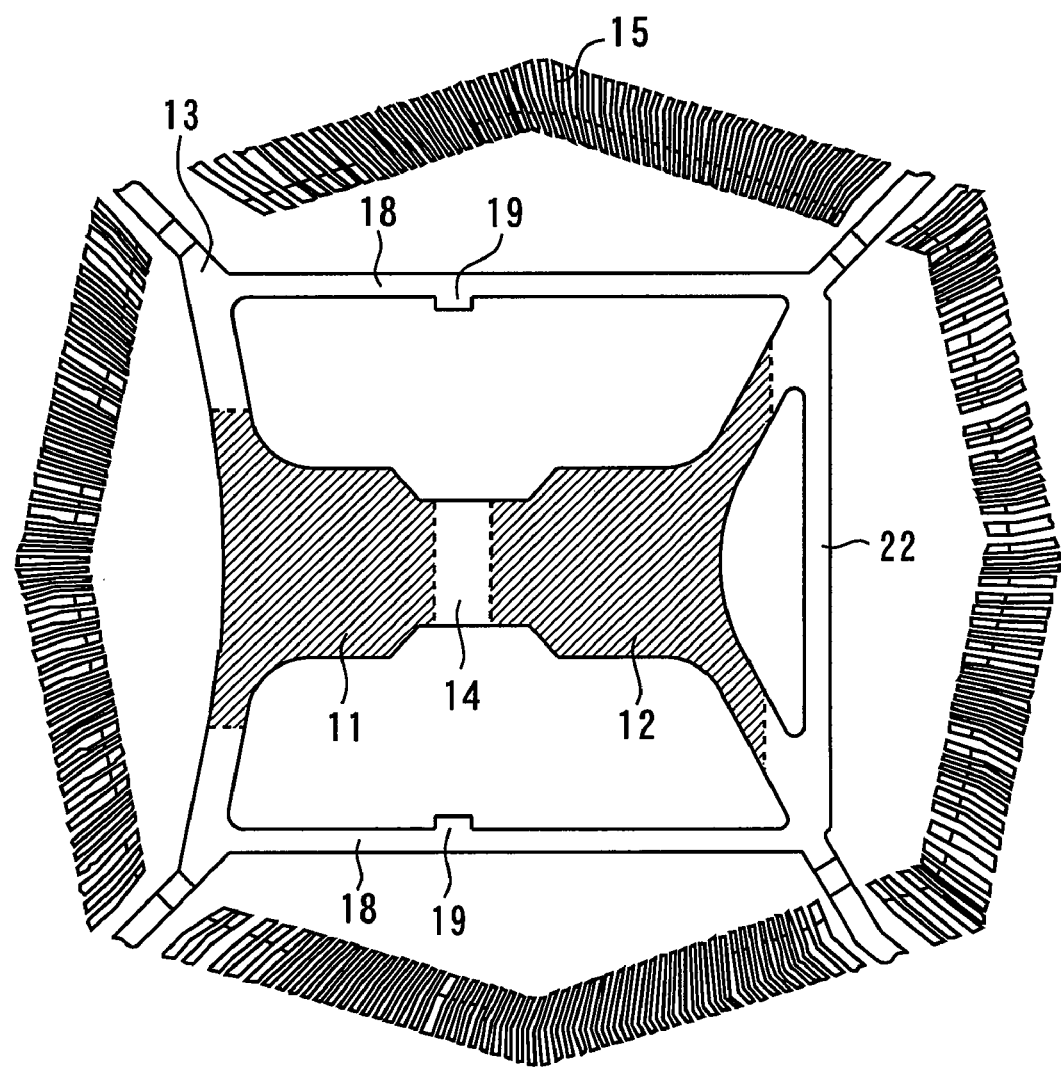
FIGS. 3-4 are plane views for explaining a method of manufacturing a semiconductor device according to a first embodiment of the present invention.

Manufacturing steps of the above described semiconductor device will be explained. First, a lead frame formed as shown in FIG. 3 is prepared. Though a plurality of patterned parts as shown in FIG. 3 are actually provided in one lead frame, the lead frame part corresponding to one package is shown for convenience. The two bars 18 are provided between the first and second die pads 11 and 12, and the inner leads 15 arrayed between the two hanger leads supporting the bars 18 and there are clearances between the bars 18 and the first and second die pads 11 and 12 and between the bars 18 and the inner leads 15 respectively. The bar 22 is also provided between the second die pad 12 and the inner leads 15 arrayed between the two hanger leads supporting the bar 22 and there are clearances between the bar 22 and the second die pad 12 and between the bar 22 and the inner leads 15 respectively.

Figure 4:
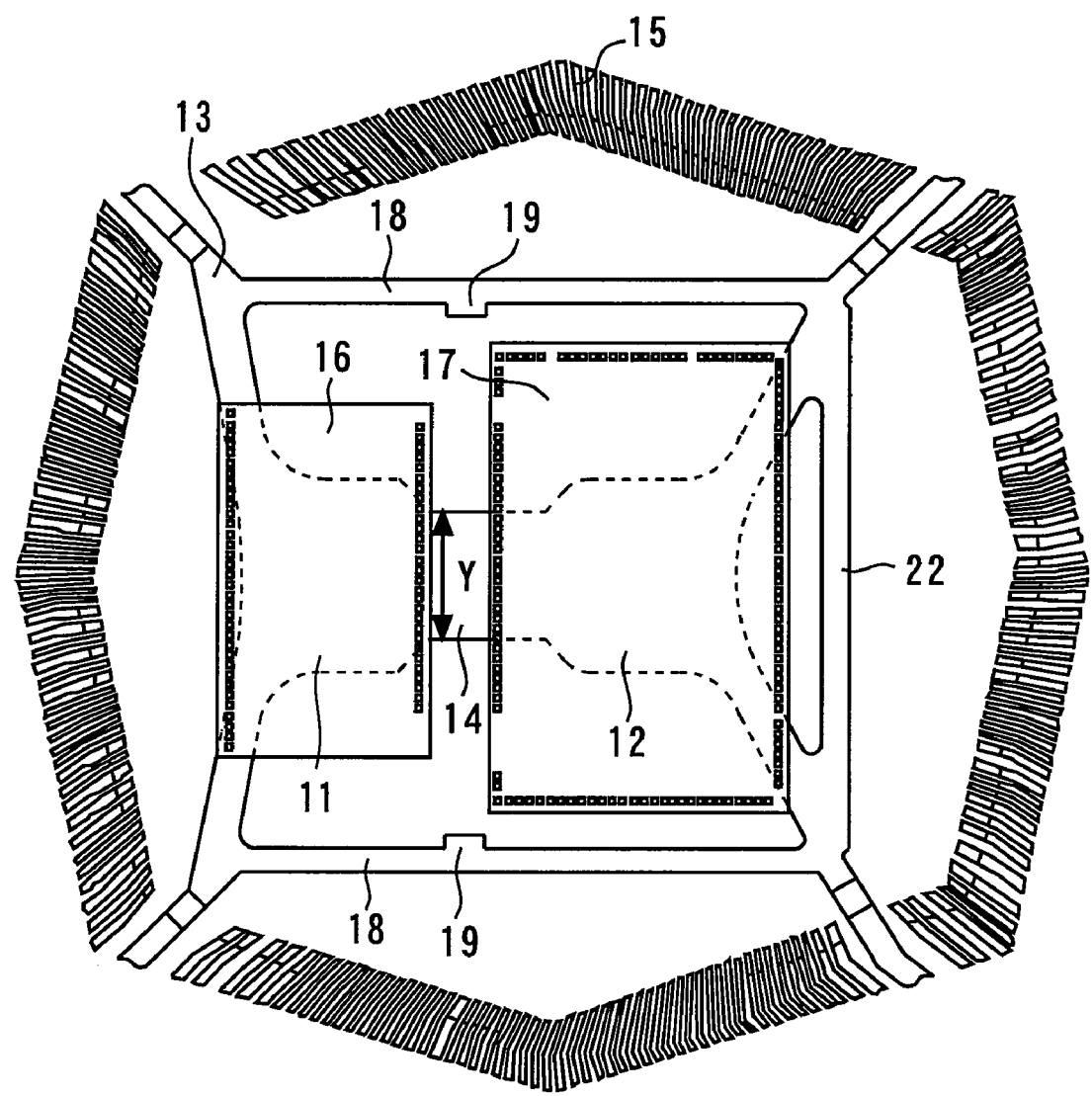

Next, as shown in FIG. 4, the first and second chips 16 and 17 are mounted on the die pads 11 and 12. The first and second chips 16 and 17 are mounted on the two hatched areas of the mounting member in FIG. 3. This embodiment adopts so-called small die pads, that is, the area of the die pad 11 is smaller than the area of the first chip 16 and the area of the die pad 12 is smaller than the area of the principal plane of the second chip 17. The peripheral four sides that define the rectangular principal plane facing the mounting member of the first chip 16 have a part not overlapping with the mounting member and the peripheral four sides that define the rectangular principal plane facing the mounting member of the second chip 17 have a part not overlapping with the mounting member.

Figure 11:
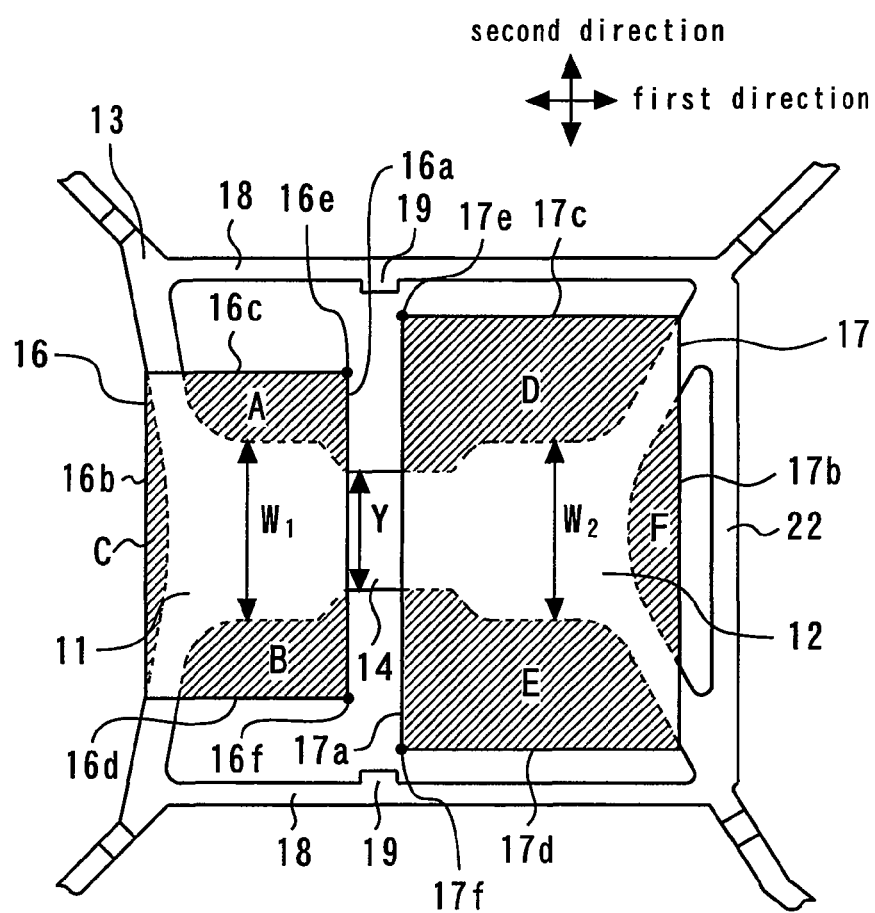
FIG. 11 is an enlarged plan view of the chip mounting part in FIG. 4.

FIG. 11 is an enlarged plan view of the chip mounting part in FIG. 4 (the pads provided on the respective chips are omitted in the figure). In the figure, the first direction is the direction in which the first and second chips 16 and 17 are arranged side by side and the second direction is the direction perpendicular to the principal plane of the mounting member and at the same time the direction perpendicular to the first direction.

The first plane facing the mounting member of the first chip 16 has a long side 16a (third side) and a long side 16b facing each other in the first direction and a short side 16c (first side) and a short side 16d (second side) facing each other in the second direction. The long side 16a crosses the short side 16c at a first point 16e and crosses the short side 16d at a second point 16f.

The second plane facing the mounting member of the second chip 17 has a long side 17a (sixth side) and a long side 17b facing each other in the first direction and a short side 17c (fourth side) and a short side 17d (fifth side) facing each other in the second direction. The long side 17a crosses the short side 17c at a third point 17e and crosses the short side 17d at a fourth point 17f.

The first plane of the first chip 16 has a part A (fourth part), a part B (fifth part) and a part C that do not overlap with the mounting member. The part A is a part surrounded by at least a part of the short side 16c that continues from the first point 16e, a part of the long side 16a that continues from the first point 16e and the outer edge of the die pad 11. The part B is a part surrounded by at least a part of the short side 16d that continues from the second point 16f, the other part of the long side 16a that continues from the second point 16f and the outer edge of the die pad 11. The part C is a part surrounded by substantially the entire long side 16b and the outer edge of the die pad 11.

The second plane of the second chip 17 has a part D (sixth part), a part E (seventh part) and a part F that do not overlap with the mounting member. The part D is a part surrounded by substantially the entire short side 17c that continues from the third point 17e, a part of the long side 17a that continues from the third point 17e and the outer edge of the die pad 12. The part E is a part surrounded by substantially the entire short side 17d that continues from the fourth point 17f, the other part of the long side 17a that continues from the fourth point 17f and the outer edge of the die pad 12. The part F is a part surrounded by at least a part of the long side 17b and the outer edge of the die pad 12. The parts A-F of the first and second chips 16 and 17 adhere to the resin 21.

The shapes of the die pads 11 and 12 need only to be small die pads and are not limited to the above described configuration. For example, no part of the short side 16c of the first chip 16 can be made to overlap with the mounting member as in the case of the short side 17c. No part of the short side 16d can also be made to overlap with the mounting member. Only part of the short side 17c of the second chip 17 that continues from the third point 17e can be made not to overlap with the mounting member as in the case of the short side 16c. Only part of the short side 17d that continues from the fourth point 17f can be made not to overlap with the mounting member.

The principal plane of the mounting member includes a first part (principal plane of the die pad 11) that overlaps with the first chip 16, a second part (principal plane of the die pad 12) that overlaps with the second chip 17 and a third part (principal plane of the connection lead 14) between the first chip 16 and the second chip 17. The area of the first part is smaller than the area of the plane that faces the mounting member of the first chip 16. The area of the second part is smaller than the area of the plane that faces the mounting member of the second chip 17.

Furthermore, the die pad is so small that a maximum width Y of the part of the mounting member located between the two chips 16 and 17 (connection lead 14) is smaller than the widths of both the chips 16 and 17 along the same direction as the width Y (second direction). More specifically, the first part (principal plane of the die pad 11) has a part where a width W1 in the second direction is greater than the maximum width Y in the second direction of the third part (principal plane of the connection lead 14). The second part (principal plane of the die pad 12) has a part where a width W2 in the second direction is greater than the maximum width Y in the second direction of the third part (principal plane of the connection lead 14).

When mounting the chips 16 and 17 on the die pads, for example, after applying a paste to the die pads 11 and 12, the chips 16 and 17 are pressed against the die pads 11 and 12 and the first and second chips 16 and 17 are thereby bonded to the mounting member. In this case, the use of the projections 19 as marks makes it easier to align the first and second chips 16 and 17. A pad for exchanging signals and a pad for receiving a supply voltage and ground voltage are formed on the principal plane of the side not to be mounted on the mounting member of the first and second chips. After the chips are mounted, the first and second chips 16 and 17 and the plurality of inner leads 15 are wire-bonded and for the connection between the first and second chips 16 and 17, the pads arranged side by side along the two mutually facing sides thereof are wire-bonded. Furthermore, part of the pad of the second chip 17 is wire-bonded to the bar 22 and is supplied with a ground-level voltage. The above described semiconductor device shown in FIG. 1 is manufactured by applying resin sealing after wire-bonding.

Since the width of the connection lead 14 is made smaller than the widths of the downsized die pads 11 and 12, there are fewer obstacles when the resin 21 inflows into a narrow clearance between the first and second chips 16 and 17. Therefore, as shown in FIG. 10, the path for the flow of the resin 21 from below can be secured and resin sealing below the wire 20b can thereby be done reliably.

On the other hand, in the case of such a semiconductor device using small die pads, when chips are mounted on the die pads, the chips cannot be aligned using the edges of the die pads or slits or the like provided for the die pads as marks. One reason is that working on and providing marks such as slits in small die pad parts raises concerns about reducing the strength of the die pads. Therefore, the two bars 18 are provided so as to face each other across the first and second chips 16 and 17. These two bars 18 are provided with the projections 19 as marks between the first chip 16 and second chip 17. Provision of the two marks in this way allows rotation mismatch between the first and second chips 16 and 17 to be detected.

Figure 5:
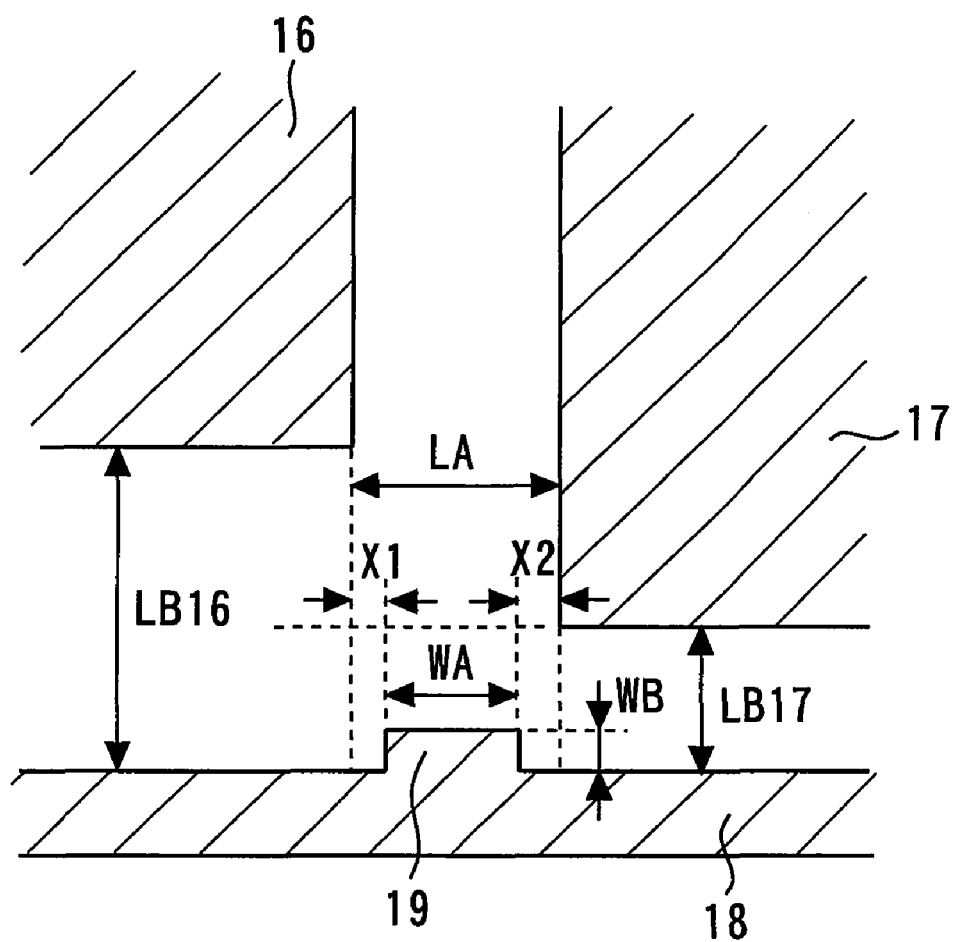
FIG. 5 is an enlarged plan view of the projection.
Figure 6:
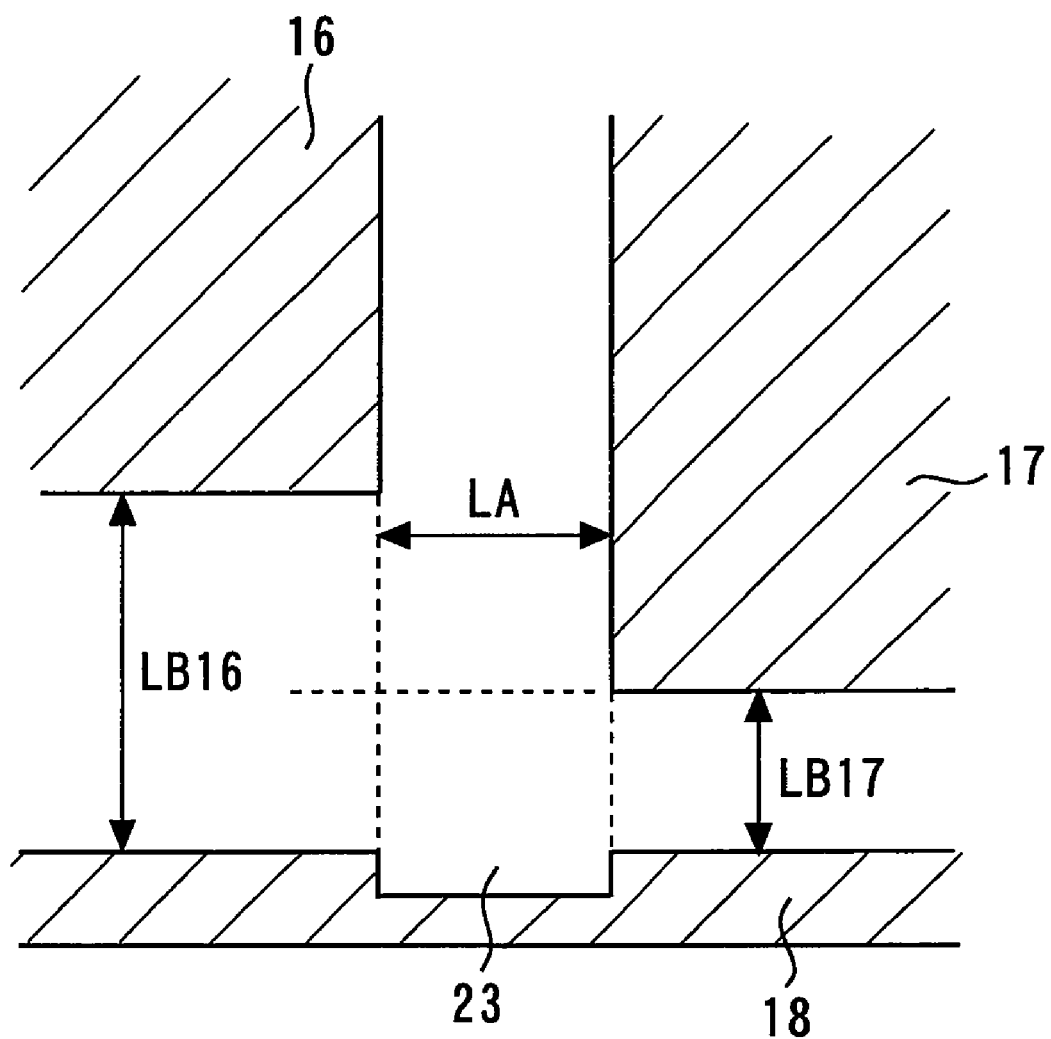
FIG. 6 is a plan view showing the mark according to a modified embodiment of a first embodiment of the present invention.

FIG. 5 is an enlarged plan view of the projection. A width WA of the projection 19 in the array direction (first direction) of the first chip 16 and the second chip 17 is smaller than a distance LA between the mutually facing sides of the first chip 16 and the second chip 17. A protruding length WB of the projection 19 is smaller than both a distance LB16 between the bar 18 and the first chip 16 in the direction orthogonal to the first direction and a distance LB17 between the bar 18 and the second chip 17 in the direction orthogonal to the first direction. When the first and second chips 16 and 17 are mounted on the mounting member, this prevents the first and second chips 16 and 17 from damaging by contacting the projections 19.

Here, the alignment method when mounting the chip 16 on the mounting member will be explained more specifically. First, by repeating a first die bonding step of die-bonding the first chip 16 to the die pad 11 using a first die bonding device one by one, a plurality of first chips 16 are mounted on different die pads 11. In the meantime, after the first chip 16 for one package is mounted on the die pad 11 of the mounting member, a distance X1 (see FIG. 5) between the side of the first chip 16 and the edge of the projection 19 is measured. Though not shown, the same applies to the projection 19 provided for the bar 18 on the opposite side, too. When the distance X1 exceeds a desired range, the first die bonding device is tuned based on the X1 measured with the preceding first chip 16 so that when die-bonding is applied to the first chip 16 of the next package, the first chip 16 is mounted on the mounting member at a position where the distance X1 between the side of the first chip 16 to be die-bonded and the edge of the projection 19 falls within a desired range.

When values of this distance X1 measured for every first die-bonding step fall within the desired range a predetermined number of times consecutively, the distance X1 will not be measured in the subsequent first die-bonding steps and the first chips 16 are die-bonded using the first die bonding device one by one assuming that the die-bonding position of the first chip 16 has been adequately tuned. The desired ranges of the distances X1 and X2 between the edges of the projection 19 and the sides of the chips 16 and 17 are, for example, within 0.2 mm, preferably within 0.1 mm and more strictly within 0.05 mm.

Next, a second die-bonding step of die-bonding the second chip to the die pad 12 for the mounting member on which the first chip 16 has been mounted is repeated one by one using a different second die bonding device. In this way, a plurality of second chips 17 are mounted on different die pads 12. In the meantime, after a certain one second chip 17 is mounted on the die pad 12 of the mounting member, the distance X2 (see FIG. 5) between the side of the second chip 17 and the other edge of the projection 19 is measured. Though not shown, the same is applied to the projection 19 provided for the bar 18 on the opposite side, too. When the distance X2 exceeds a desired range, the second die bonding device is tuned based on the distance X2 measured with the preceding second chip 17 so that when die-bonding is applied to the second chip 17 of the next package, the second chip 17 is mounted on the mounting member at a position where the distance X2 between the side of the second chip 17 to be die-bonded and the edge of the projection 19 falls within a desired range.

When values of this distance X2 measured for every second die-bonding step fall within the desired range a predetermined number of times consecutively, the distance X2 will not be measured in the subsequent second die-bonding steps and the second chips 17 are die-bonded using the second die bonding device one by one with the die-bonding position of the second chips 17 accurately tuned.

As long as the width of the mark in the extending direction of the bar can be identified as the mark for alignment of the two chips, the mark may also be a recessed part 23 formed in the side of the bar 18 facing the first and second chips. Suppose the width of the recessed part 23 is a distance LA between the first chip and the second chip. If the distances between both edges of the recessed part 23 and the sides of the chips 16 and 17 fall within an allowable range, for example, within ±0.2 mm, preferably within ±0.1 mm or more strictly within ±0.05 mm, the respective facing sides of the first and second chips 16 and 17 may be deviated from the corresponding edges of the recessed part 23. Furthermore, the locations of the bar where marks are put are not limited to the sides facing the chips. The mark locations may be the top surface of the bar or opposite side as long as the mark locations are positions of the separation area between the chips in the extending direction of the bar.

Second Embodiment

Figure 7:
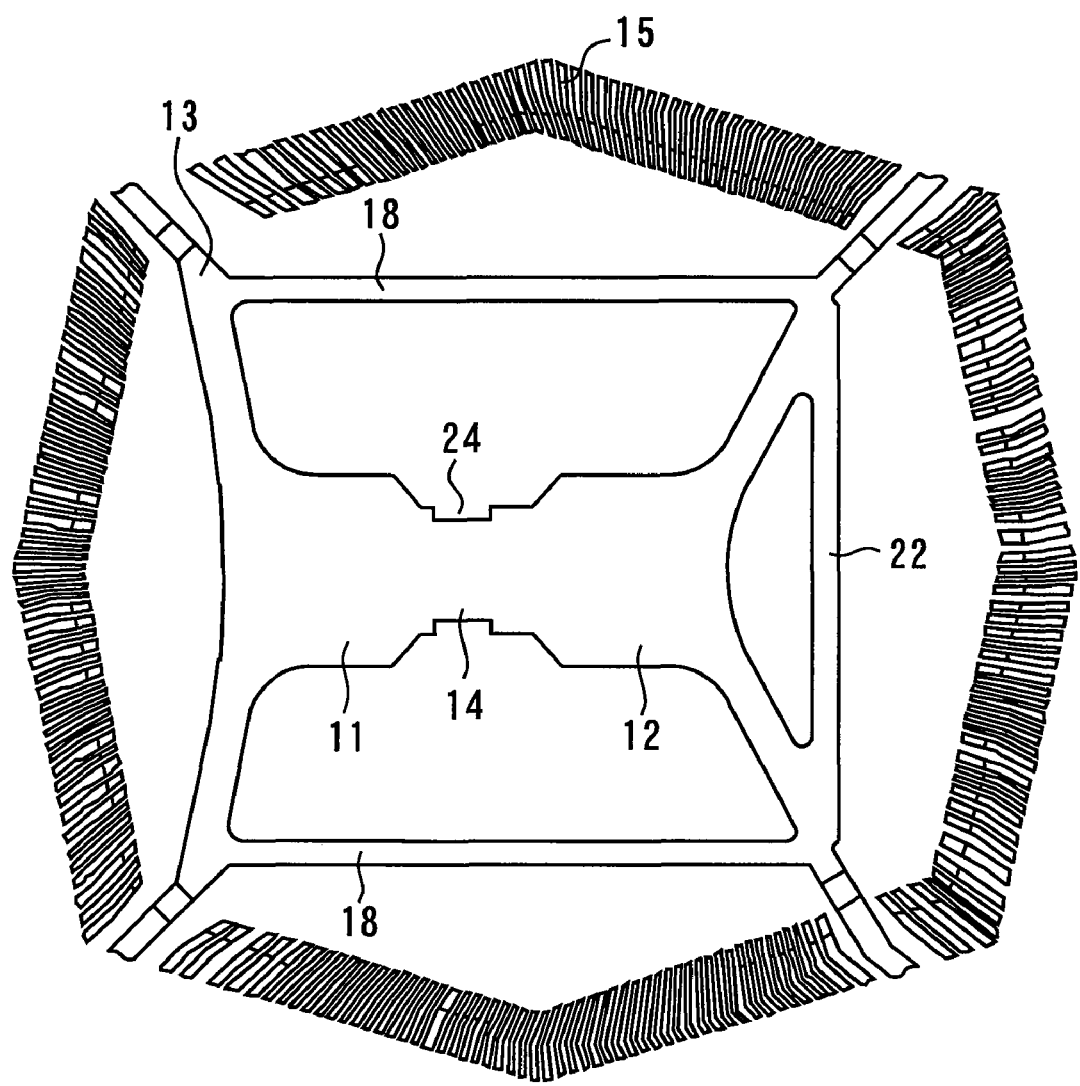
FIGS. 7-8 are plane views for explaining a method of manufacturing a semiconductor device according to a second embodiment of the present invention.
Figure 8:
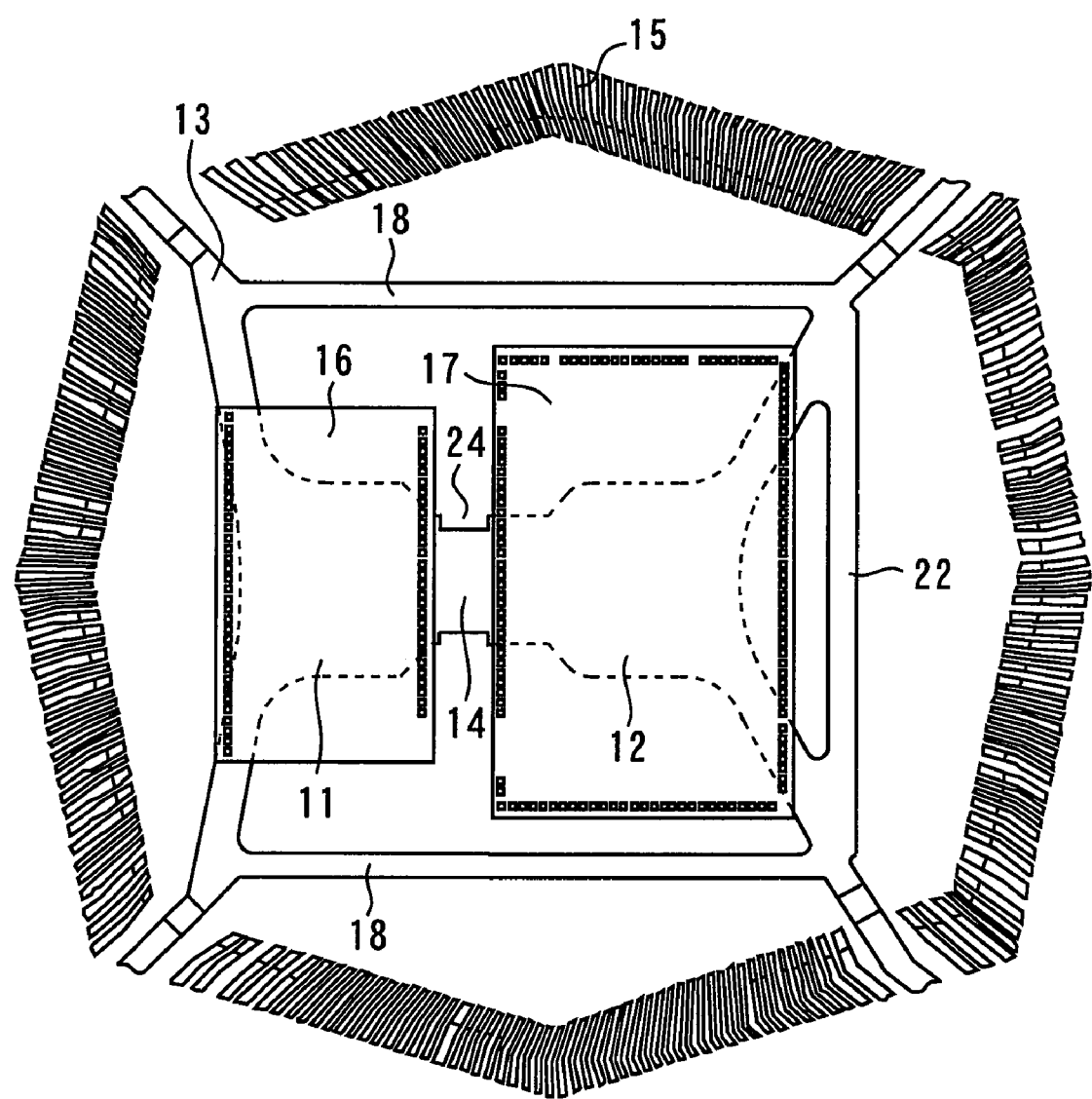
Figure 9:
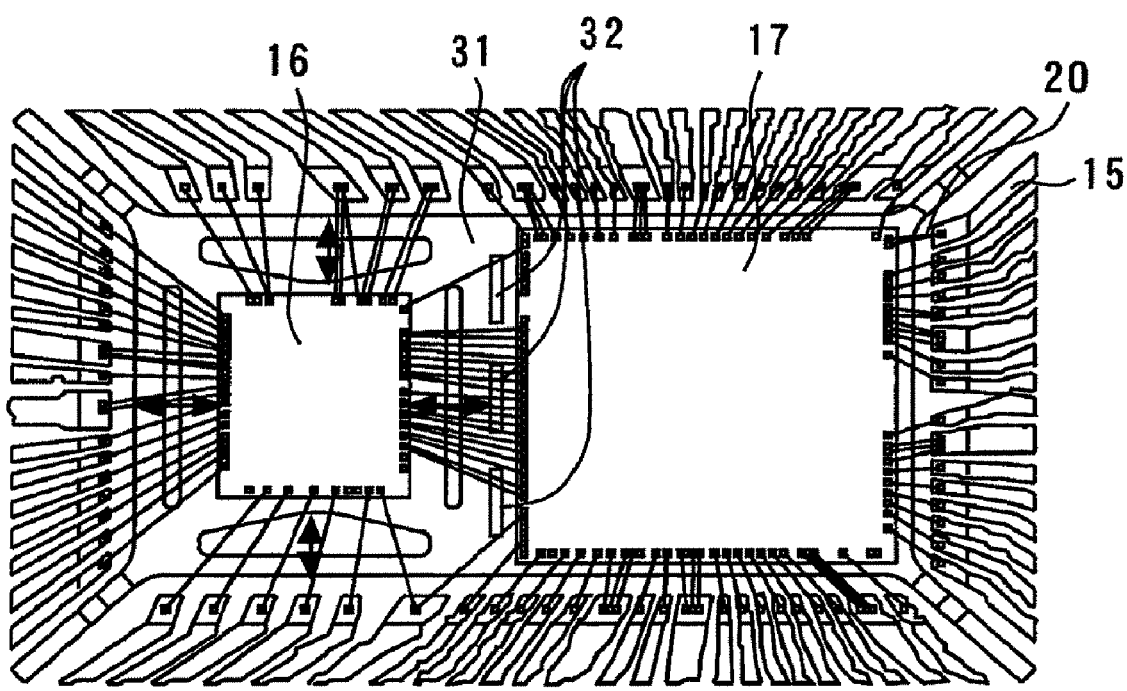
FIG. 9 is a plan view showing a conventional semiconductor device in which two chips are mounted side by side on a large die pad.

In this second embodiment, as shown in FIG. 7, recessed parts 24 are provided in the connection lead 14 as marks instead of providing the marks in the bars 18 as in the case of the first embodiment. That is, the mounting member has the connection lead 14 (third part) located between the first and second chips 16 and 17 for coupling the first die pad 11 (first part) and the second die pad 12 (second part). The sides where the first die pad 11 is contiguous to the second die pad 12 via the connection lead 14 are provided with recessed parts 24 which are recessed in an inward direction of the sides. The bottom face of this recessed part 24 is located at least at the connection lead 14. As shown in FIG. 8, the first and second chips 16 and 17 are mounted on the die pads 11 and 12. The rest of the configuration is the same as that of the first embodiment. When the chips 16 and 17 are mounted on the die pads, the use of the recessed parts 24 as marks in this way makes it easier to align the first and second chips 16 and 17.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-253405, filed on Sep. 28, 2007 and a Japanese Patent Application No. 2008-196751, filed on Jul. 30, 2008 including specification, claims, drawings and summary, on which the Convention priority of the present application is based, are incorporated herein by reference in its entirety.

What is claimed is:

1. A semiconductor device comprising:
   a first and second die pads arranged side by side;
   a plurality of inner leads arranged around the first and second die pads;
   first and second chips mounted on the first and second die pads;
   a bar provided between the first and second chips and the plurality of inner leads, extending in an array direction of the first chip and the second chip;
   a plurality of wires that connect the first and second chips and the plurality of inner leads and connect the first chip and the second chip; and
   resin that seals the first and second die pads, the plurality of inner leads, the first and second chips, the plurality of wires and the bar,
   wherein the bar comprises a mark provided at a position corresponding to an area between the first chip and the second chip in an array direction of the first chip and the second chip.

2. The semiconductor device according to claim 1, wherein the bar is electrically grounded.

3. The semiconductor device according to claim 1, wherein the two bars are provided so as to face each other across the first and second chips and the two bars comprise marks provided between the first chip and the second chip respectively.

4. The semiconductor device according to claim 1, wherein the first and second die pads are smaller than the first and second chips.

5. A semiconductor device comprising:
   a mounting member;
   a first chip mounted on the mounting member, a principal plane of which is superimposed on a first part of the mounting member;
   a second chip mounted on the mounting member, a principal plane of which is superimposed on a second part which is different from the first part of the mounting surface of the mounting member and a side of which is arranged at a distance from and opposed to a side of the first chip in a first direction;
   a plurality of inner leads arranged around the first and second chips;
   a bar that is provided so as to be located between the first and second chips and some of the plurality of inner leads and extends in the first direction;
   a plurality of wires that connect the first and second chips and the plurality of inner leads; and
   resin that seals the first and second chips, the mounting member, the plurality of inner leads, the bar and the plurality of wires,
   wherein the bar is provided on a side of the bar facing the first and second chips, faces a separation area between the first chip and the second chip and comprises a mark having a predetermined width in the first direction.

6. The semiconductor device according to claim 5, wherein the bar is electrically grounded.

7. The semiconductor device according to claim 5, wherein the mark is a projection that protrudes from a side of the bar in a direction in which the first and second chips are arranged.

8. The semiconductor device according to claim 7, wherein a length by which the projection protrudes is smaller than both a distance between the bar and the first chip in a direction orthogonal to the first direction and a distance between the bar and the second chip in a direction orthogonal to the first direction.

9. The semiconductor device according to claim 7, wherein a width of the mark in the first direction is smaller than a distance between mutually facing sides of the first and second chips.

10. The semiconductor device according to claim 5, further comprising another bar provided between the first and second chips and other some of the plurality of inner leads and provided at a position facing the bar across the first and second chips,
    wherein the other bar comprises another mark provided on a side of the other bar facing the first and second chips and provided so as to face a separation area between the first chip and the second chip.

11. The semiconductor device according to claim 10, wherein the bar and the other bar are electrically grounded.

12. The semiconductor device according to claim 10, wherein the mark is a projection that protrudes from a side of the bar to the first and second chips and the other mark is a projection that protrudes from a side of the other bar to the first and second chips.

13. The semiconductor device according to claim 5, wherein an area of the first part of the mounting member is smaller than an area of a principal plane of the first chip, an area of the second part of the mounting member is smaller than an area of a principal plane of the second chip, four sides defining the principal plane of the first chip facing the mounting member comprise a part not overlapping with the mounting member and four sides defining the principal plane of the second chip facing the mounting member comprise a part not overlapping with the mounting member.

14. A semiconductor device comprising:
a mounting member;
a first chip mounted on the mounting member, a principal plane of which is superimposed on a first part of the mounting member;
a second chip mounted on the mounting member, a principal plane of which is superimposed on a second part which is different from the first part of the mounting surface of the mounting member and a side of which is arranged at a distance from and opposed to a side of the first chip in a first direction;
a plurality of inner leads arranged around the first and second chips;
a plurality of wires that connect the first and second chips and the plurality of inner leads; and
resin that seals the first and second chips, the mounting member, the plurality of inner leads and the plurality of wires,
wherein the mounting member comprises a third part located between the first and second chips for coupling the first part and the second part, and
a side that continues from the first part to the second part via the third part comprises a recessed part which is recessed in an inward direction of the side and a bottom face of the recessed part is located at least in the third part.

15. A semiconductor device comprising:
a metallic mounting member;
a first chip mounted on a principal plane of the mounting member;
a second chip mounted on the principal plane of the mounting member so as to be arranged side by side at a distance from the first chip in a first direction;
a plurality of inner leads arranged around the first and second chips;
a plurality of first wires that connect the first and second chips and the plurality of inner leads;
a plurality of second wires that connect the first chip and the second chip; and
resin that seals the plurality of inner leads, the first and second chips, the plurality of first wires and the plurality of second wires,
wherein the principal plane of the mounting member comprises a first part overlapping with the first chip, a second part overlapping with the second chip and a third part interposed between the first chip and the second chip,
an area of the first part is smaller than an area of the plane of the first chip facing the mounting member,
an area of the second part is smaller than an area of the plane of the second chip facing the mounting member,
the first part comprises a part whose width in a second direction perpendicular to both a direction perpendicular to the principal plane and the first direction is larger than a maximum width of the third part in the second direction, and
the second part comprises a part whose width in the second direction is larger than a maximum width of the third part in the second direction.

16. The semiconductor device according to claim 15, wherein a first plane of the first chip facing the mounting member comprises a first side, a second side facing the first side in the second direction and a third side that crosses the first side at a first point and crosses the second side at a second point,
a second plane of the second chip facing the mounting member comprises a fourth side, a fifth side facing the fourth side in the second direction and a sixth side that crosses the fourth side at a third point, crosses the fifth side at a fourth point and faces the third side in the first direction,
the first plane comprises:
a fourth part that includes at least a part of the first side that continues from the first point and a part of the third side that continues from the first point and does not overlap with the mounting member; and
a fifth part that includes at least a part of the second side that continues from the second point and the other part of the third side that continues from the second point and does not overlap with the mounting member, and
the second plane comprises:
a sixth part that includes at least a part of the fourth side that continues from the third point and a part of the sixth side that continues from the third point and does not overlap with the mounting member; and
a seventh part that includes at least a part of the fifth side that continues from the fourth point and the other part of the sixth side that continues from the fourth point and does not overlap with the mounting member.

* * * * *